United States Patent
Suganuma et al.

(10) Patent No.: US 10,332,853 B2
(45) Date of Patent: Jun. 25, 2019

(54) BONDING STRUCTURE AND METHOD FOR PRODUCING BONDING STRUCTURE

(71) Applicant: OSAKA UNIVERSITY, Osaka (JP)

(72) Inventors: Katsuaki Suganuma, Suita (JP); Shijo Nagao, Suita (JP); Chulmin Oh, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 0 days.

(21) Appl. No.: 15/116,104

(22) PCT Filed: Feb. 3, 2015

(86) PCT No.: PCT/JP2015/052999
§ 371 (c)(1),
(2) Date: Aug. 2, 2016

(87) PCT Pub. No.: WO2015/115665
PCT Pub. Date: Aug. 6, 2015

(65) Prior Publication Data
US 2017/0170137 A1    Jun. 15, 2017

(30) Foreign Application Priority Data
Feb. 3, 2014    (JP) .................................. 2014-018163

(51) Int. Cl.
*H01L 23/48*    (2006.01)
*H01L 23/00*    (2006.01)
(Continued)

(52) U.S. Cl.
CPC ............ *H01L 24/16* (2013.01); *H01L 23/367* (2013.01); *H01L 23/42* (2013.01); *H01L 24/11* (2013.01);
(Continued)

(58) Field of Classification Search
CPC ......... H01L 24/16; H01L 24/11; H01L 24/32; H01L 2224/11848; H01L 2224/16057; H01L 2224/16227; H01L 2224/27848
See application file for complete search history.

(56) References Cited

U.S. PATENT DOCUMENTS

2010/0190298 A1* 7/2010 Kuramoto ............. H01L 21/187
438/121
2010/0237382 A1* 9/2010 Kamei .................... H01L 33/16
257/99
(Continued)

FOREIGN PATENT DOCUMENTS

| JP | 2009-164208 A | 7/2009 |
| JP | 2009-289745 A | 12/2009 |
| JP | 2011-071301 A | 4/2011 |
| JP | 2012-015313 A | 1/2012 |
| JP | 5207281 B2 | 6/2013 |

OTHER PUBLICATIONS

JP Office Action dated May 30, 2017, from corresponding JP Appl No. 2015-560078, with English translation, 6 pp.
(Continued)

*Primary Examiner* — Victor A Mandala
*Assistant Examiner* — Colleen E Snow
(74) *Attorney, Agent, or Firm* — Studebaker & Brackett PC

(57) ABSTRACT

A bonding structure (100) of the present invention includes a substrate (110), a metal film (120), a semiconductor element (130). The substrate (110), the metal film (120), and the semiconductor element (130) are laminated in order just mentioned. The metal film (120) contains a metal diffused through stress migration, and the substrate (110) and the semiconductor element (130) are bonded together with the metal film (120) therebetween.

18 Claims, 6 Drawing Sheets

(51) Int. Cl.
*H01L 23/367* (2006.01)
*H01L 23/42* (2006.01)
*H01L 23/373* (2006.01)

(52) U.S. Cl.
CPC .............. *H01L 24/29* (2013.01); *H01L 24/32* (2013.01); *H01L 24/81* (2013.01); *H01L 24/83* (2013.01); *H01L 23/3736* (2013.01); *H01L 23/3737* (2013.01); *H01L 24/13* (2013.01); *H01L 2224/0345* (2013.01); *H01L 2224/0346* (2013.01); *H01L 2224/0401* (2013.01); *H01L 2224/04026* (2013.01); *H01L 2224/05573* (2013.01); *H01L 2224/05666* (2013.01); *H01L 2224/05671* (2013.01); *H01L 2224/05684* (2013.01); *H01L 2224/11848* (2013.01); *H01L 2224/13294* (2013.01); *H01L 2224/13339* (2013.01); *H01L 2224/16057* (2013.01); *H01L 2224/16227* (2013.01); *H01L 2224/27848* (2013.01); *H01L 2224/2916* (2013.01); *H01L 2224/29118* (2013.01); *H01L 2224/29124* (2013.01); *H01L 2224/29139* (2013.01); *H01L 2224/29144* (2013.01); *H01L 2224/29147* (2013.01); *H01L 2224/29155* (2013.01); *H01L 2224/29157* (2013.01); *H01L 2224/29164* (2013.01); *H01L 2224/29294* (2013.01); *H01L 2224/29339* (2013.01); *H01L 2224/32225* (2013.01); *H01L 2224/81007* (2013.01); *H01L 2224/8183* (2013.01); *H01L 2224/8184* (2013.01); *H01L 2224/83007* (2013.01); *H01L 2224/8383* (2013.01); *H01L 2224/8384* (2013.01); *H01L 2224/83193* (2013.01)

(56) References Cited

U.S. PATENT DOCUMENTS

| | | | |
|---|---|---|---|
| 2012/0225514 A1* | 9/2012 | Wada | H01L 27/14618 438/65 |
| 2013/0093091 A1* | 4/2013 | Ma | H01L 21/76898 257/751 |
| 2014/0027648 A1* | 1/2014 | Petersson | G01T 3/08 250/370.05 |
| 2015/0249133 A1* | 9/2015 | Yanase | H01L 24/83 257/77 |
| 2016/0322327 A1* | 11/2016 | Hino | H01L 24/83 |

OTHER PUBLICATIONS

M. Yasuda et al., "Effect of Passivation Layers on the Shape of Ag Hillocks Formed by Stress-Induced Migration," The Japan Society of Mechanical Engineers, Mechanical Engineering Congress, Sep. 12, 2009, (8), Japan, pp. 81-82.

International Search Report issued in PCT/JP2015/052999; dated Mar. 17, 2015.

Habib A. Mustain et al.; "Transient Liquid Phase Die Attach for High-Temperature Silicon Carbide Power Devices"; IEEE Transactions on Components and Packaging Technologies; Sep. 2010; pp. 563-570; vol. 33; No. 3.

Chulmin Oh et al.; "Thermomechanical stress driven Ag direct bonding"; The 8th Pacific Rim International Congress on Advanced Materials and Processing; 2013; pp. 2017-2023; TMS (The Minerals, Metals & Materials Society).

* cited by examiner

BONDING STRUCTURE AND METHOD FOR PRODUCING BONDING STRUCTURE

TECHNICAL FIELD

The present invention relates to a bonding structure and a method for producing a bonding structure.

BACKGROUND ART

In a process of mounting a semiconductor element, the semiconductor element and a substrate are bonded together with a bonding material. For example, a next-generation power semiconductor element (for example, a silicon carbide semiconductor, or a gallium nitride semiconductor) is used as the semiconductor element. Patent Literature 1 discloses a method for laminating a semiconductor element and a substrate with a bonding material therebetween and then sintering the semiconductor element and the substrate in a heating furnace to bond the two together.

CITATION LIST

Patent Literature

[Patent Literature 1] Japanese Patent Application Laid-Open Publication No. 2011-071301

SUMMARY OF THE INVENTION

Technical Problem

However, bonding the semiconductor element and the substrate together through, for example, high-temperature soldering under a high temperature breaks the semiconductor element or the substrate by thermal stress or causes a void on a soldering bonding interface.

In view of the problem described above, the present invention has been made, and it is an object of the present invention to provide a bonding structure that can easily and favorably bonded even at low temperature environment.

Solution to Problem

A bonding structure according to the present invention includes, in order mentioned below: a substrate; a metal film; and a semiconductor element. The metal film contains a metal diffused mainly through stress migration. The substrate and the semiconductor element are bonded together with the metal film therebetween.

In one embodiment, either or both of a material contained in the substrate and a material contained in the semiconductor element have a lower thermal expansion coefficient than the metal contained in the metal film.

In one embodiment, the bonding with the metal film proceeds through a redox reaction occurring on a surface before the bonding.

In one embodiment, the metal film is a single layer. In one embodiment, the metal film has a plurality of the metal films that are laminated.

In one embodiment, the metal contained in the metal film has a crystal in a fine state or a columnar state.

A bonding structure according to the present invention includes; in order mentioned below: a substrate; a first metal film; a thermal stress absorber; a second metal film; and a semiconductor element. A least one of a metal contained in the first metal film and a metal contained in the second metal film is diffused through stress migration, The substrate and the thermal stress absorber are bonded together with the first metal film therebetween. The semiconductor element and the thermal stress absorber are bonded together with the second metal film therebetween.

In one embodiment, a material contained in the substrate has a lower thermal expansion coefficient than the metal contained in the first metal film, and a material contained in the semiconductor element has a lower thermal expansion coefficient than the metal contained in the second metal film.

In one embodiment, a material contained in the thermal stress absorber has a lower thermal expansion coefficient than the metal contained in the first metal film and the metal contained in the second metal film.

In one embodiment, either or both of the metal contained in the first metal film and the metal contained in the second metal film has a crystal in a fine state or a columnar state.

In one embodiment, the material contained in the thermal stress absorber is silicon, carbon, niobium, molybdenum, or tungsten.

In one embodiment, the thermal stress absorber has a through hole or a recess.

In one embodiment, the material contained in the substrate or the material contained in the semiconductor element is silicon, carbon, niobium, molybdenum, or tungsten.

In one embodiment, the bonding with at least one of the first metal film and the second metal film proceeds through a redox reaction occurring on a surface before the bonding.

A method for producing a bonding structure according to the present invention includes: forming a metal film; producing a laminated body; and bonding. In the forming a metal film, the metal film is formed on at least one of a surface of a substrate and a surface of a semiconductor element. In the producing a laminated body, the laminated body is produced by superposing the substrate and the semiconductor element oppositely to each other in a manner such that the metal film formed on the surface of the substrate and the metal film formed on the surface of the semiconductor element make contact with each other or in a manner such that the metal film formed on the surface of the substrate or the metal film formed on the surface of the semiconductor element is arranged between the substrate and the semiconductor element. In the bonding, the substrate and the semiconductor element are bonded together by heating the laminated body and diffusing either or both of a metal contained in the metal film formed on the surface of the substrate and a metal contained in the metal film formed on the surface of the semiconductor element through stress migration.

In one embodiment, the bonding is performed at a temperature of at least 100° C. and no greater than 400° C.

In one embodiment, in the forming a metal film, the metal film is formed on the surface of the substrate and the surface of the semiconductor element. Then in the producing a laminated body, a thermal stress absorber is laminated between the metal film formed on the surface of the substrate and the metal film formed on the surface of the semiconductor element.

Advantageous Effects of the Invention

The present invention can provide a bonding structure that can favorably and easily be bonded even under low temperature environment.

DESCRIPTION OF EMBODIMENTS

Figure 1:
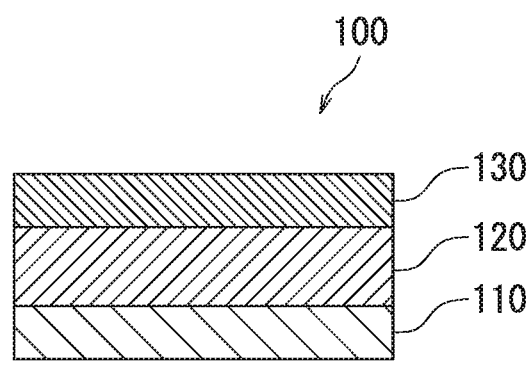
FIG. 1 is a view illustrating a cross section of a bonding structure according to a first embodiment of the present invention.

Hereinafter, embodiments of the present invention will be described in detail. The present invention is of course not in any way limited by the following embodiments and appropriate alterations may be made in practice within the intended scope of the present invention. Although explanation is omitted as appropriate in order to avoid repetition, such omission does not limit the essence of the present invention.

[First Embodiment (First Bonding Structure)]

The bonding structure (first bonding structure) according to the first embodiment of the present invention includes a substrate, a metal film, and a semiconductor element in order just mentioned. Through diffusion of a metal contained in the metal film through stress migration, the substrate and the semiconductor element are bonded together with the metal film therebetween.

The bonding is achieved through stress migration occurring inside the metal film. The stress migration is a phenomenon that a defect (for example, a void or a crack) is caused which is attributable to a stress gradient caused inside of materials having different thermal expansion coefficients due to a difference in thermal expansion coefficient as a result of a temperature change upon heat application to the materials brought into contact with each other. That is, the stress migration causes a failure when a plurality of types of materials are used, and is one of factors contributing to a failure in a semiconductor device.

However, it is ventured to adopt, in the bonding structure of the present embodiment, stress migration which is originally a cause of a defect, thereby maintaining a favorable bonding state in the bonding structure of the present embodiment. More specifically, heating two types of materials with greatly different thermal expansion properties while bringing the materials into contact with each other causes a stress gradient inside of a metal. The gradient causes stress migration, so that the metal (a metal element) is diffused in a manner such as to overflow. The diffused metal fills in a clearance of an interface attributable to unevenness of a surface of the substrate or a surface of the semiconductor element for integration to favorably bond the substrate and the semiconductor element together. The occurrence of stress migration can be identified by photographing a bonded cross section with a device such as a scanning electron microscope (SEM). In formation of a bonded part, nanoparticles or amorphous nan tissues can be formed through surface reaction in bonding atmosphere to promote growth of bonding necking.

To bond a substrate and a semiconductor element together, a technique (for example, sintering) that requires heat treatment at a high temperature has typically been used in conventional practices. However, the substrate and the semiconductor element are bonded together by utilizing stress migration of a metal film as described above in the present embodiment. A temperature at which stress migration is caused to occur is lower than a sintering temperature, which can therefore provide a bonding structure capable of being bonded even under low temperature environment in the present embodiment. Therefore, even in a case where either of heat resistance of the substrate and heat resistance of the semiconductor element is low, the both can favorably be bonded together. Moreover, no large-scale apparatus such as a heating furnace is required, thus making it possible to perform the bonding through a simple process and thus achieve cost reduction. Further, it is possible to perform bonding at low temperatures and with low pressure, and thus it is possible to use a low-cost, commercial metal such as a copper.

Hereinafter, a first bonding structure 100 will be described with reference to FIG. 1. As shown in FIG. 1, a substrate 110 and a semiconductor element 130 are bonded together with a metal film 120 therebetween in the first bonding structure 100. A stress gradient is caused in the metal film 120 and the metal film is diffused to maintain a bonded state.

Stress migration is only required to be caused to occur on at least either of an interface between the substrate 110 and the metal film 120 and an interface between the metal film 120 and the semiconductor element 130.

Hereinafter, the substrate 110, the metal film 120, and the semiconductor element 130 forming the first bonding structure 100 will be described.

(Substrate)

Examples of a material contained in the substrate 110 include: glass, silica glass, silicon, silicon carbide, gallium nitride, gallium nitride formed on silicon, silicon nitride, aluminum nitride, and alumina, carbon, tungsten, niobium, molybdenum, titanium, Invar alloy (an alloy containing iron, nickel, manganese, and carbon), and a kovar alloy (an alloy containing iron, nickel, cobalt, manganese, and silicon).

To perform favorable bonding through stress migration, a material contained in the substrate 110 preferably has a lower thermal expansion coefficient (linear expansion coefficient) (unit: 1/K) than a metal contained in the metal film 120. Specifically, a ratio of the thermal expansion coefficient of a metal contained in the metal film 120 relative to the thermal expansion coefficient of the material contained in the substrate 110 (the thermal expansion coefficient of the metal contained in the metal film 120/the thermal expansion coefficient of the material contained in the substrate 110) is preferably two or more. The material contained in the substrate 110 has a thermal expansion coefficient of, for example, at least $0.1 \times 10^{-6}$ and less than $10.0 \times 10^{-6}$.

(Metal Film)

Examples of the metal contained in the metal film 120 include copper, silver, zinc, gold, palladium, aluminum, nickel, cobalt, and iron. To provide excellent versatility and cost performance and also provide a thermal expansion coefficient that can easily cause stress migration to occur, the metal contained in the metal film 120 is preferably copper, silver, zinc, aluminum, cobalt, or nickel.

The metal film 120 may have a plurality of metal films that are laminated. In a case where the metal film 120 has a plurality of metal films that are laminated, metals contained in the plurality of metal films may be of the same type or of different types. In this case, bonding proceeds in a manner such that the metal diffused through the stress migration fills unevenness on the surface of the substrate 110, a surface of the metal film 120, and the surface of the semiconductor element 130.

To provide excellent bonding strength and easily cause stress migration to occur, the metal film 120 preferably has a thickness of at least 0.5 μm and no greater than 30.0 μm.

As described above, the metal contained in the metal film 120 preferably has a higher thermal expansion coefficient (linear expansion coefficient) than the material contained in the substrate 110. Specifically, a ratio of the thermal expansion coefficient of the metal contained in the metal film 120 relative to the thermal expansion coefficient of the material contained in the substrate 110 (the thermal expansion coefficient of the metal contained in the metal film 120/the thermal expansion coefficient of the material contained in the substrate 110) is preferably two or more. More specifically, the metal contained in the metal film 120 has a thermal expansion coefficient of, for example, $10.0 \times 10^{-6}$ or more.

The metal contained in the metal film 120 preferably has a crystal in a fine state (more specifically, in particulates in units of approximately sub microns) or a columnar state. When the crystal is in a columnar state, the metal contained in the metal film is diffused along the surface or a grain boundary, and thus stress migration can more easily be caused to occur compared to a metal having a rough equiaxial crystal, thus achieving a favorable bonding state.

Figure 2A:
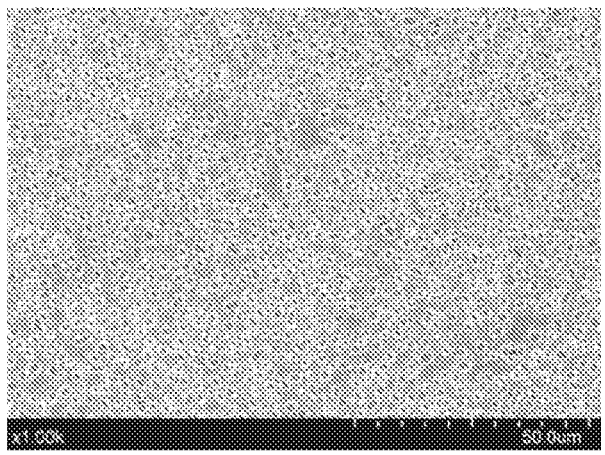
FIGS. 2A to 2C are SEM photographs illustrating crystal growth in stress migration.
Figure 2B:
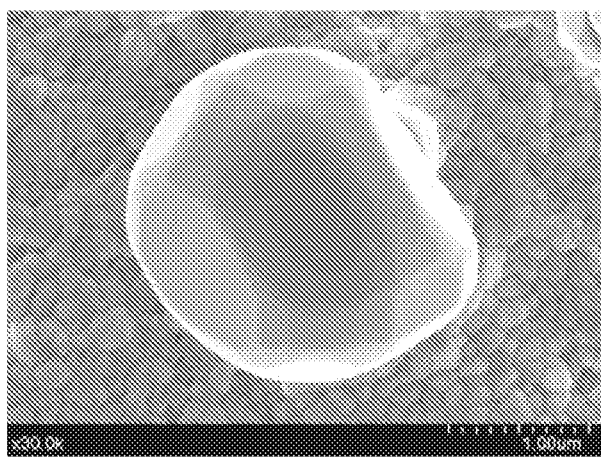
Figure 2C:
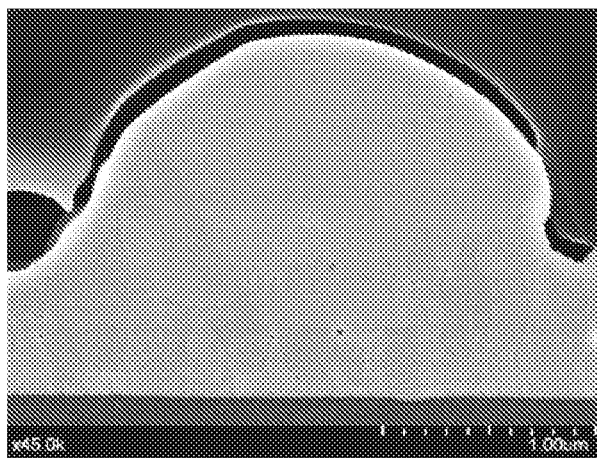

Occurrence of stress migration of a metal will be further described with reference to FIG. 2A to 2C. FIG. 2A is an SEM photograph obtained by photographing a state after forming a metal film (silver film) of silver on a surface of a substrate formed of silicon and performing heating at a temperature of 250° C. to cause stress migration to occur. FIG. 2B is an enlarged view of FIG. 2A. FIG. 2C is an SEM photograph obtained by photographing a cross section of FIG. 2B. As is clear from FIGS. 2A, 2B, and 2C, it can be confirmed that, as a result of causing the stress migration to occur through the heating, the silver on the surface of the silver film grows and the silver is projected in particles in a manner such as to overflow. In the present embodiment, through diffusion of the projected metal (for example, silver) and filling of the unevenness present on the surface of the substrate 110, the metal film 120, or the surface of the semiconductor element 130 by utilizing the occurrence of the stress migration of the metal, a favorable bonding state can be maintained.

To effectively cause the stress migration to occur to provide a favorable bonding state in the first bonding structure 100, preferable combination of the metal contained in the metal film 120 and the material contained in the substrate 110 (the metal film 120 and the substrate 110), is, for example, silver and silicon, silver and carbon, silver and molybdenum, silver and tungsten, copper and silicon, copper and carbon, copper and molybdenum, or copper and tungsten.

(Semiconductor Element)

Examples of the material contained in the semiconductor element 130 include those illustrated above as the materials contained in the substrate 110.

To perform favorable bonding through the stress migration, the material contained in the semiconductor element 130 preferably has a lower thermal expansion coefficient (linear expansion coefficient) than the metal contained in the metal film 120. Specifically, a ratio of the thermal expansion coefficient of the metal contained in the metal film 120 relative to the thermal expansion coefficient of the material contained in the semiconductor element 130 (the thermal expansion coefficient of the metal contained in the metal film/the thermal expansion coefficient of the material contained in the semiconductor element) is preferably 2.0 or more. More specifically, the material contained in the semiconductor element 130 has a thermal expansion coefficient of at least $0.1 \times 10^{-6}$ and less than $10.0 \times 10^{-6}$.

To effectively cause stress migration to occur to provide a favorable bonding state in the first bonding structure 100, a preferable combination of the metal contained in the metal film 120 and the material contained in the semiconductor element 130 (the metal film 120/the semiconductor element 130) is, for example, silver and gallium nitride, silver and silicon carbide, copper and gallium nitride, or copper and silicon carbide.

Hereinafter, one example of each of the thermal expansion coefficient of the metal contained in the metal film, the thermal expansion coefficient of the material contained in the substrate, and the thermal expansion coefficient of the material contained in the semiconductor element is shown. In the present specification and scope of the claims, the thermal expansion coefficient refers to a linear expansion coefficient, and a unit of the thermal expansion coefficient is "1/K".

One Example of the Thermal Expansion Coefficient of the Metal Contained in the Metal Film
Aluminum: $23.0 \times 10^{-6}$
Iron: $12.0 \times 10^{-6}$
Cobalt: $13.0 \times 10^{-6}$
Nickel: $12.8 \times 10^{-6}$
Gold: $14.3 \times 10^{-6}$
Copper: $16.8 \times 10^{-6}$
Zinc: $30.2 \times 10^{-6}$
Silver $18.9 \times 10^{-6}$
Palladium $11.8 \times 10^{-6}$
Alumina $7.2 \times 10^{-6}$ One Example of Thermal Expansion Coefficient of the Material Contained in the Substrate or Material Contained in the Semiconductor Element
Silicon $2.6 \times 10^{-6}$
Tungsten $4.3 \times 10^{-6}$
Niobium $8.0 \times 10^{-6}$
Molybdenum $4.9 \times 10^{-6}$
Silicon carbide $3.7 \times 10^{-6}$
Gallium nitride $3.0 \times 10^{-6}$
Silicon nitride $3.0 \times 10^{-6}$
Aluminum nitride $5.0 \times 10^{-6}$
Alumina $7.0 \times 10^{-6}$
Graphite $0.1 \times 10^{-6}$-$7.0 \times 10^{-6}$
Titanium $11 \times 10^{-6}$
Invar alloy $1.2 \times 10^{-6}$
Kovar alloy $5.0 \times 10^{-6}$ An oxide film is preferably not present on the surface of the metal film 120. That is, the metal contained in the metal film 120 is preferably not oxidized. This is because, even with presence of a stress gradient inside of the metal film 120, diffusion and bonding are insufficient in the metal where the oxidization has occurred, which is a main cause of a bonding failure. To avoid surface oxidization, it is also possible to perform bonding treatment under reducing atmosphere or vacuum atmosphere. Alternatively, the bonding is preferably performed in condition (a temperature, atmosphere, or under presence of a solution) that promotes redox reaction on the surface of the metal.

An adhesive layer may be formed, when necessary, between the substrate 110 and the metal film 120 or between the semiconductor element 130 and the metal film 120 in the first bonding structure 100. The adhesive layer is formed for the purpose of strengthening the bonding between the substrate 110 and the metal film 120 or the bonding between the semiconductor element 130 and the metal film 120. A material contained in the adhesive layer is, for example, titanium. The adhesive layer has a thickness of, for example, at least 0.01 µm and no greater than 0.05 µm.

Note that each of the substrate 110 and the semiconductor element 130 may not be necessarily flat-shaped, and at least either of the substrate 110 and the semiconductor element 130 may have flexibility. Alternatively, at least either of the substrate 110 and the semiconductor element 130 may have a curved shape.

Moreover, the metal film 120 is separated, and the semiconductor element 130 may be mounted as a flip chip on the substrate 110.

Figure 3:
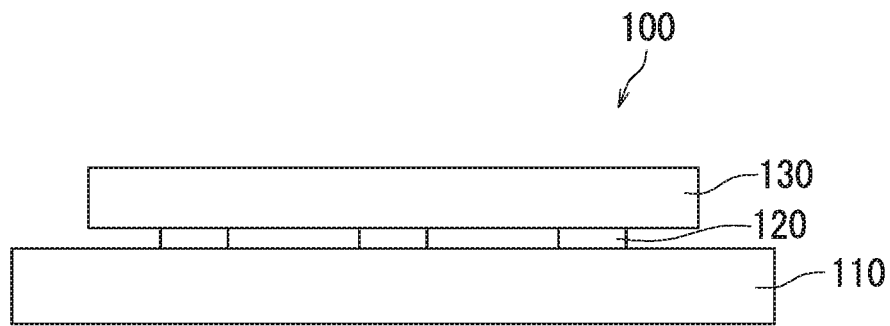
FIG. 3 is a view illustrating a cross section of the bonding structure according to the present embodiment.

FIG. 3 shows a schematic view of the bonding structure 100 of the present embodiment. While the metal film 120 is divided into two or more, the substrate 110 and the semiconductor element 130 are bonded together.

The metal films 120 may be arranged along a straight line at predetermined intervals. Alternatively, the metal films 120 may be arranged while separated in a matrix form.

The metal film 120 may have a laminated structure. For example, after forming a laminated structure of titanium, copper, titanium and silver on the substrate 110 while forming a laminated structure of titanium, copper, titanium and silver on the semiconductor element 130, a laminated body having the semiconductor element 130 laminated on the substrate 110 in a manner such that silver layers of the respective laminated structures make contact with each other may be produced to thereby fabricate the bonding structure 100.

[Second Embodiment (Second Bonding Structure)]

Figure 4:
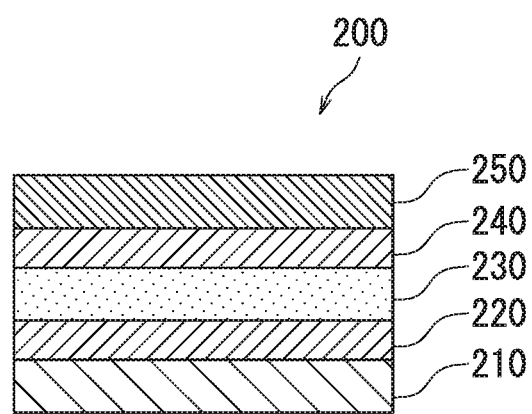
FIG. 4 is a view illustrating a cross section of a bonding structure according to a second embodiment of the present invention.

With reference to FIG. 4, another example of the bonding structure of the present embodiment (second bonding structure) will be described. As illustrated in FIG. 4, the second bonding structure 200 includes a substrate 210, a first metal film 220, a thermal stress absorber 230, a second metal film 240, and a semiconductor element 250 in order just mentioned. In the second bonding structure, a metal contained in the first metal film 220 is diffused through stress migration, and the substrate 210 and the thermal stress absorber 230 are bonded together with the first metal film 220 therebetween. Further, a metal contained in the second metal film 240 is diffused through stress migration, and the semiconductor element 250 and the thermal stress absorbing member 230 are bonded together with the second metal film 240 therebetween.

Hereinafter, the substrate 210, the first metal film 220, the second metal film 240, the thermal stress absorber 230, and the semiconductor element 250 in the second bonding structure 200 will be described.

(Substrate)

Examples of a material contained in the substrate 210 include: glass, silica glass, silicon carbide, gallium nitride, gallium nitride formed on silicon, carbon, silicon nitride, aluminum nitride; alumina, tungsten, niobium, molybdenum, titanium, Invar alloys (an alloy containing iron, nickel, manganese, and carbon); and a kovar alloy (an alloy containing iron, nickel, cobalt, manganese, and silicon).

To favorably perform bonding through stress migration, the material contained in the substrate 210 preferably has a lower thermal expansion coefficient (linear expansion coefficient; unit "1/K") than a metal contained in the first metal film 220. Specifically, a ratio of the thermal expansion coefficient of the metal contained in the first metal film 220 with respect to the thermal expansion coefficient of the material contained in the substrate 210 (the thermal expansion coefficient of the metal contained in the first metal film 220/thermal expansion coefficient of the material contained in the substrate 210) is preferably two or more. The material contained in the substrate 210 has a thermal expansion coefficient of, for example, at least $0.1 \times 10^{-6}$ and less than $10.0 \times 10^{-6}$.

(First Metal Film)

Examples of the metal contained in the first metal film 220 include: copper, silver, zinc, gold, palladium, aluminum, nickel, cobalt, and iron. To provide excellent general versatility and cost-effectiveness and also provide a thermal expansion coefficient that can easily cause stress migration to occur, copper, silver, zinc, aluminum, cobalt, or nickel is preferable The first metal film 220 may have a plurality of metal films that are laminated. In a case where the first metal film 220 has the plurality of metal films that are laminated, metals contained in the first metal film 220 may be of the same type or of different types. In this case, the bonding proceeds in a manner such that the metal diffused through the stress migration fills unevenness on a surface of the substrate 210 or a surface of the thermal stress absorber 230.

To provide excellent bonding strength and easily cause stress migration to occur, the first metal film 220 preferably has a thickness of at least 0.5 µm and no greater than 30.0 µm.

As described above, the metal contained in the first metal film 220 preferably has a higher thermal expansion coefficient (linear expansion coefficient) than the material contained in the substrate 210. Specifically, a ratio of the thermal expansion coefficient of the metal contained in the first metal film 220 with respect to the thermal expansion coefficient of the material contained in the substrate 210 (the thermal expansion coefficient of the metal contained in the first metal film 220/the thermal expansion coefficient of the material contained in the substrate 210) is preferably two or more. More specifically, the metal contained in the first metal film 220 has a thermal expansion coefficient of, for example, $10.0 \times 10^{-6}$ or more.

The metal contained in the first metal film 220 preferably has a crystal in a fine state (more specifically, a fine state approximately in units of sub microns) or a columnar state. With the crystal in the fine state or the columnar state, the metal contained in the first metal film 220 is diffused along a surface or a grain boundary, and thus compared to a metal whose crystal state is a rough equiaxial crystal, stress migration can more easily be caused to occur, providing a favorable bonding state.

To effectively cause stress migration to occur to provide a favorable bonding state, examples of a preferable combination of the metal contained in the first metal film 220 and the material contained in the substrate 210 (first metal film 220/substrate 210) in the second bonding structure 200 include: silver and silicon, silver and carbon, silver and molybdenum, silver and tungsten, copper and silicon, copper and carbon, copper and molybdenum, and copper and tungsten.

(Second Metal Film)

Examples of the metal contained in the second metal film 240 include copper, silver, zinc, gold, palladium, aluminum, nickel, cobalt, and iron. To provide excellent general versatility and cost-effectiveness and also provide a thermal expansion coefficient that can easily cause stress migration to occur, copper, silver, zinc, aluminum, cobalt, or nickel is preferable.

The second metal film 240 may have a plurality of metal films that are laminated. In a case where the second metal film 240 has a plurality of metal films that are laminated, the metals contained in the plurality of metal films of the second metal films 240 may be of the same type or of different types. In this case, the bonding proceeds in a manner such that any metal diffused through the stress migration fills the unevenness on the semiconductor element 250 or the surface of the thermal stress absorber 230.

To provide excellent bonding strength and easily cause stress migration to occur, the second metal film 240 preferably has a thickness of at least 0.5 μm and no greater than 30.0 μm.

The metal contained in the second metal film 240 preferably has a higher thermal expansion coefficient (linear expansion coefficient) than the material contained in the semiconductor element 250. Specifically, a ratio of the thermal expansion coefficient of the metal contained in the second metal film 240 with respect to the thermal expansion coefficient of the material contained in the semiconductor element 250 (the thermal expansion coefficient of the metal contained in the second metal film 240/the thermal expansion coefficient of the material contained in the semiconductor element 250) is preferably two or more. More specifically, the metal contained in the second metal film 240 has a thermal expansion coefficient of, for example, $10.0 \times 10^{-6}$ or more.

The metal contained in the second metal film 240 preferably has a crystal in a fine state (more specifically, in a fine state in units of approximately sub microns) or in a columnar state. With the crystal in the columnar state, the metal contained in the second metal film 240 is diffused along a surface or a grain boundary, and thus compared to a metal having a crystal in a rough equiaxial state, stress migration can more easily be caused to occur, thus providing a favorable bonding state.

(Semiconductor Element)

Examples of the material contained in the semiconductor element 250 include those illustrated above as the materials contained in the substrate 210.

To favorably perform bonding through the stress migration, the material contained in the semiconductor element 250 preferably has a lower thermal expansion coefficient (linear expansion coefficient) than the metal contained in the second metal film 240. Specifically, a ratio of the thermal expansion coefficient of the material contained in the second metal film 240 with respect to the thermal expansion coefficient of the material contained in the semiconductor element 250 (the thermal expansion coefficient of the metal contained in the second metal film 240/the thermal expansion coefficient of the material contained in the semiconductor element 250) is preferably 2.0 or more. More specifically, the material contained in the semiconductor element 250 has a thermal expansion coefficient of at least $0.1 \times 10^{-6}$ and less than $10.0 \times 10^{-6}$.

To effectively cause stress migration to occur to provide a favorable bonding state, examples of a preferable combination of the metal contained in the second metal film 240 and the material contained in the semiconductor element 250 (second metal film 240/semiconductor element 250) in the second bonding structure 200 include: silver and gallium nitride, silver and silicon carbide, copper and gallium nitride, and copper and silicon carbide.

(Thermal Stress Absorber)

Providing the thermal stress absorber 230 can suppress thermal shock upon heating, causing favorable stress migration to occur. Examples of the material contained in the thermal stress absorber 230 include the same as those contained in the substrate 210 or those contained in the semiconductor element 250 described above. To cause favorable stress migration to occur, preferable materials contained in the thermal stress absorber 230 include silicon, molybdenum, tungsten, graphite, silicon carbide, silicon nitride, aluminum nitride, alumina, or an Invar alloy.

To effectively cause stress migration to occur to perform favorable bonding, the material contained in the thermal stress absorber 230 preferably has a lower thermal expansion coefficient (linear expansion coefficient) than the metal contained in the first metal film 220 and the metal contained in the second metal film 240. More specifically, the material contained in the thermal stress absorbing member 230 has a thermal expansion coefficient of at least $0.1 \times 10^{-6}$ and less than $10.0 \times 10^{-6}$.

At least part of the surface of the thermal stress absorber 230 is preferably coated with a metal film. The coating can more effectively cause stress migration to occur to favorably perform bonding. Examples of a metal contained in the metal film for coating the surface of the thermal stress absorber 230 include the same materials as the metal contained in the first metal film 220 and the metal contained in the second metal film 240.

The thermal stress absorber 230 preferably has a through hole or a recess. This introduces the metal to the through hole or the recess, so that a stress gradient between the metal and the thermal stress absorber 230 becomes more remarkable. As a result, the metal is diffused in a manner such as to overflow from the through hole or the recess, permitting stress migration to be more effectively caused to occur to provide a favorable bonding state.

Figure 5:
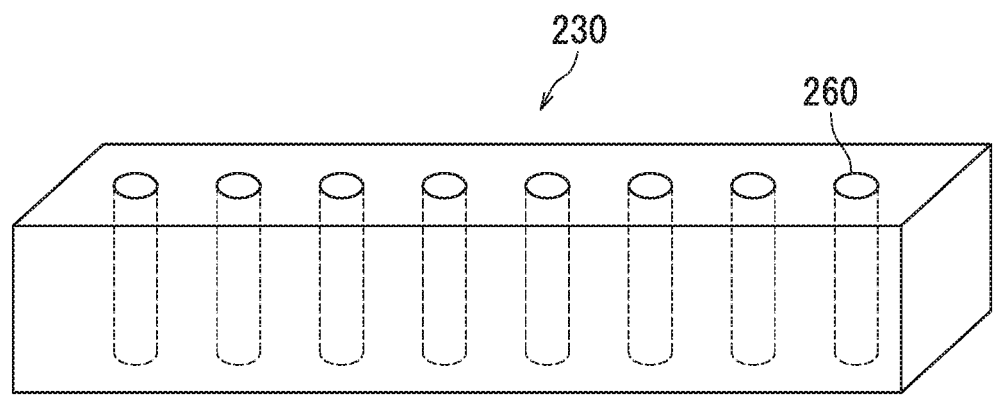
FIG. 5 is a view illustrating one example of a thermal stress absorber.
Figure 6:
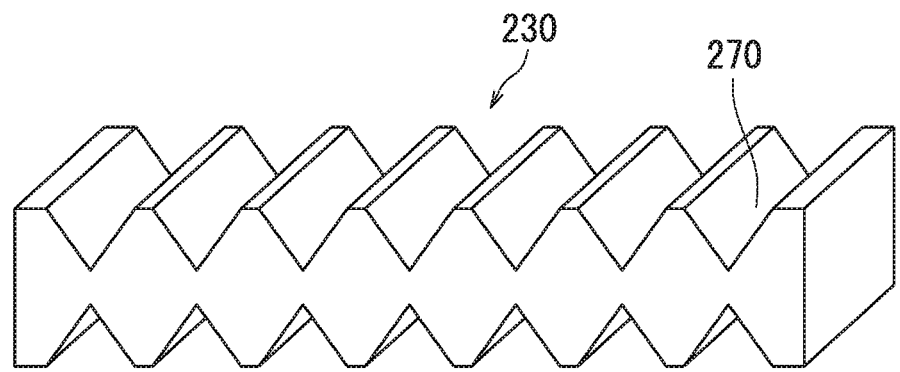
FIG. 6 is a view illustrating another example of a thermal stress absorber.
Figure 7:
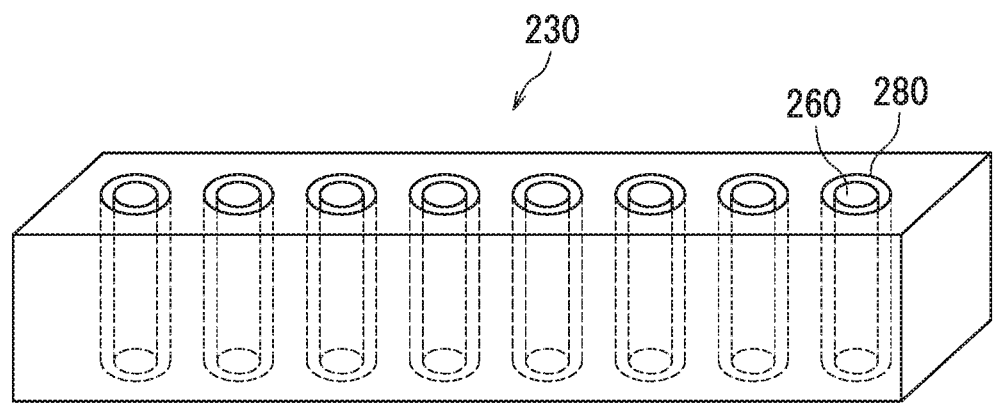
FIG. 7 is a view illustrating another example of a thermal stress absorber.

FIGS. 5 to 7 show detailed examples of a shape of the thermal stress absorber 230. For example, the thermal stress absorber 230 has a rectangular parallelepiped, and through holes 260 may further be arranged at equal intervals as shown in FIG. 5. More specifically, the through holes 260 of approximately 0.2 mm in diameter may be arranged at equal intervals of approximately 5 mm. Alternatively, although not illustrated, the through holes 260 may randomly be arranged in the thermal stress absorber 230.

A plurality of grooves 270 may be arranged as recesses in parallel at equal intervals in the thermal stress absorber 230, as illustrated in FIG. 6. The recesses may be recessed in a circular form, although not illustrated. Further, the through holes 260 may be formed of annular members 280 arranged at equal intervals as illustrated in FIG. 7, or may be formed of randomly arranged annular members, although not illustrated.

Note that each of the substrate 210, the thermal stress absorber 230, and the semiconductor element 250 may not necessarily be flat-shaped, and any of them may have flexibility. Alternatively, any of the substrate 210, the thermal stress absorber 230, and the semiconductor element 250 may be curved.

A method for producing the bonding structures (the first bonding structure and the second bonding structure) of the present embodiment will be described below. The method for producing the bonding structures of the present embodiment includes a metal film formation process, a laminated body production process, and a bonding process.

(Metal Film Formation Process)

The metal film formation process is a process for performing formation of a metal film on a surface of the substrate or formation of a metal film on a surface of the semiconductor element. To form a metal film on the surface of the substrate or on the surface of the semiconductor element, a technique such as spattering treatment, plating, or evaporation can be used. The metal film formation can be performed a plurality of times.

In the metal film process, a metal film may be formed on both the surface of the substrate and the surface of the semiconductor element. In this case, a bonding structure produced includes a plurality of (that is, two or more layers) metal films that are laminated.

No limitation is placed on a technique of the spattering treatment, and for example, RF (high-frequency) spattering or DC (direct current) spattering can be adopted.

No limitation is placed on the plating method, and for example, electrolytic plating or non-electrolytic plating can be adopted.

No limitation is placed on the evaporation method, and for example, vacuum evaporation using resistive heating can be adopted.

An adhesive layer may be provided between the substrate and the metal film or between the semiconductor element and the metal film through an appropriate method, when necessary. Examples of a material contained in the adhesive layer include titanium, tungsten, chromium, hafnium, and a nitride thereof (for example, titanium nitride, and hafnium nitride).

(Laminated Body Production Process)

In a case where a metal film is formed on both the surface of the substrate and the surface of the semiconductor element in the metal film formation process, the laminated body production process is a process for producing a laminated body by laminating the substrate and the semiconductor element in a manner such that the metal film formed on the surface of the substrate and the metal film formed on the surface of the semiconductor element make contact with each other. In this case, a bonding structure produced includes a plurality of metal films that are laminated.

Alternatively, in a case where a metal film is formed on either of the surface of the substrate and the surface of the semiconductor element in the metal film formation process, the laminated body production process is a process for producing a laminated body by laminating the substrate and the semiconductor element in a manner such that a metal film formed on the surface of the substrate or a metal film formed on the surface of the semiconductor element is arranged between the substrate and the semiconductor element. In this case, the produced bonding structure includes a single-layer metal film.

To produce a bonding structure including a thermal stress absorber, a metal film is first formed on the surface of the substrate and a metal film is formed on the surface of the semiconductor element in the metal film formation process. Then, a thermal stress absorber is laminated between the metal film formed on the surface of the substrate and the metal film formed on the surface of the semiconductor element in the laminated body production process.

In a case where a thermal stress absorber having a surface coated with a metal film is used, the metal film is first formed on the surface of the substrate or the metal film is formed on the surface of the semiconductor element in the metal film formation process. Then a thermal stress absorber is laminated between the metal film formed on the surface of the substrate and the semiconductor element or between the substrate and the metal film formed on the surface of the semiconductor element. A metal film may previously be formed on at least one of both surfaces of the thermal stress absorber.

(Bonding Process)

The bonding process is a process in which the laminated body obtained through the laminated body production process is heated and either or both of a metal contained in the metal film formed on the surface of the substrate and a metal contained in the metal film formed on the surface of the semiconductor element is diffused through stress migration to fill a space at an interface between the substrate and the semiconductor element with the metal to bond the both together.

A temperature to which the laminated body is heated is preferably at least 100° C. and no greater than 400° C. Further, the temperature is desirably at least 150° C. and no greater than 300° C. With the production method of the present embodiment, the metal film diffusion through the stress migration is utilized for the bonding, and thus even through heating at a temperature as low as no greater than 400° C., the bonding can favorably be performed. Performing the bonding at a temperature over 400° C. is not preferable since such bonding may result in breakage of the substrate or the semiconductor element by heat or may cause a void near a bonding part between the two. Moreover, with the production method of the present embodiment, the metal film diffusion through the stress migration is utilized to perform the bonding, which can therefore provide a lower pressure upon performance of the bonding process. More specifically, no pressure can be applied or a low pressure of no greater than 1 MPa can be provided.

Atmosphere upon the performance of the bonding process may be in the air or in vacuum. Alternatively, the atmosphere may be inactive gas or reduced (for example, argon, nitrogen, hydrogen, or formic acid) atmosphere.

In a case where the metal film is formed of a metal easily oxidized, an oxide film may be formed on the surface of the metal film. The presence of the oxide film may lead to a failure to favorably diffuse the metal, and thus it is preferable to perform heating in vacuum or inactive gas atmosphere or perform heating while removing the oxide film by using a reducing solvent in the bonding process. To remove the oxide film, for example, a technique of heating the laminated body in atmosphere of, for example, hydrogen or formic acid (gas) can be used.

Although the details are still in review, when the surface of the metal film is projected through the stress migration, nanoparticles are observed in a manner such as to promote necking formation between particles near the projected portion.

Figure 8A:
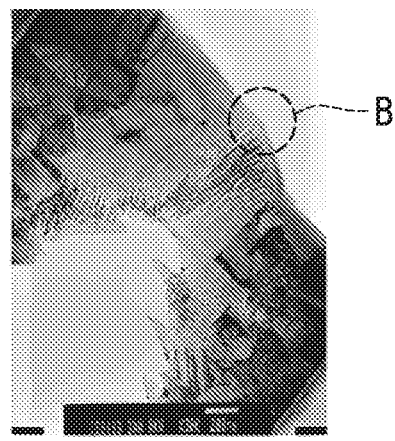
FIG. 8A is a view illustrating a cross section of a silver film on which stress migration has occurred.
Figure 8B:
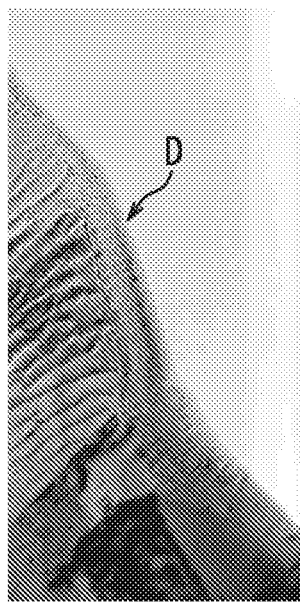
FIG. 8B is a partially enlarged view of FIG. 8A.
Figure 8C:
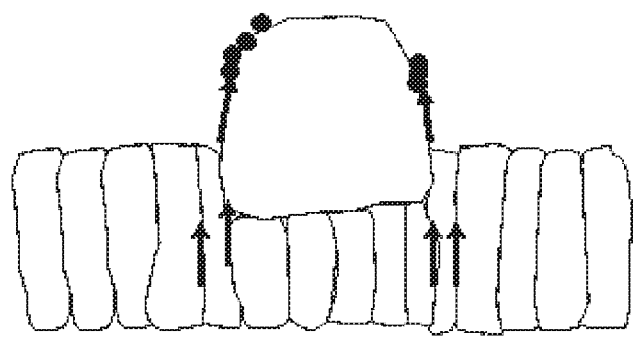
FIG. 8C is a schematic view illustrating stress migration of a metal.

FIG. 8A is a view illustrating a cross section of a silver film formed through the stress migration. FIG. 8B is an enlarged view of a region B of FIG. 8A. FIG. 8C is a schematic view illustrating stress migration of a metal.

As is clear from FIGS. 8A and 8B, in a case where the surface of the silver film is projected through the stress migration, the nanoparticles are formed near the projected portion. On a most top surface of the silver film illustrated by arrow D in FIG. 8B, silver nanoparticles and an oxidized layer are present. It is assumed that redox reaction proceeds while generating the nanoparticles to promote sintering, which in turn proceeds the bonding.

Currently, as illustrated in FIG. 8C, the nano-sized particles move from an inside of the silver film along the oxidized layer in a direction normal to the surface, and it is assumed that the nano-sized particles are closely related to the stress migration.

Figure 9:
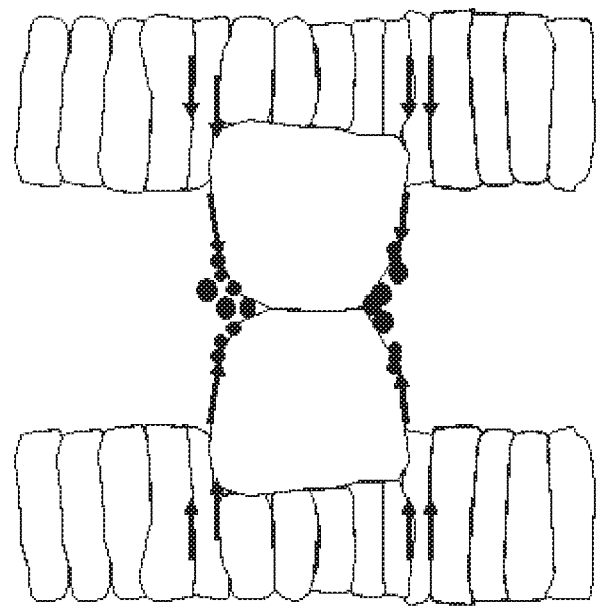
FIG. 9 is a schematic view illustrating bonding achieved through the stress migration of the metal.

FIG. 9 is a schematic view illustrating the bonding through the stress migration of the metal. As illustrated in FIG. 9, immediately after start of the bonding, the metals are projected in particles in a manner such as to overflow from respective insides of the two metal films to make contact with each other, forming bonding necking. It is assumed that energy at the contact region is relatively high and thus the nanoparticles of the metals, which have been generated following the surface reaction, move from the respective insides of the two metal films towards the contact region to fill a recess of the bonding neck, as a result of which the projected region becomes horizontally enlarged to finally bond together the two metal films.

EXAMPLES

Hereinafter, the present invention will be described in more detail, referring to the examples. Note that the present invention is not in any way limited by the following examples.

Example 1

(Metal Film Formation Process)

A silicon wafer (sized 6 mm×6 mm×0.5 mm) as a substrate was prepared. A one side surface of the silicon was subjected to sputtering treatment with titanium to form an adhesive layer (of 0.04 μm in thickness). Copper was evaporated on a surface of the adhesive layer formed of titanium (at an evaporation rate of 30 nm/min) to form a metal film (copper film) (of 1.0 μm in thickness) on a surface of the substrate.

A silicon wafer (sized 3 mm×3 mm×0.5 mm) as a semiconductor element was prepared. One side surface of a silicon wafer surface was subjected to spattering treatment with titanium to form an adhesive layer (of 0.04 μm in thickness). Copper was evaporated on a surface of the adhesive layer formed of titanium (at an evaporation rate of 30 nm/min) to form a metal film (copper film) (of 1.0 μm in thickness) on a surface of the semiconductor element.

The evaporation in the metal film formation process was performed by making argon flow under environment with a pressure of $5.0 \times 10^{-3}$ Pa.

(Laminated Body Production Process)

Subsequently, with the metal film formed on the surface of the substrate and the metal film formed on the surface of the semiconductor element in contact with each other, the two silicon wafers (the substrate and the semiconductor element) were laminated to each other to obtain a laminated body.

(Bonding Process)

The obtained laminated body was firmly fixed and heated at 250° C. for 60 minutes. Through the heating, a stress gradient occurs in each of the metal film formed on the surface of the substrate and the metal film formed on the surface of the semiconductor element, and stress migration occurs, whereby the metals were diffused. The metal films were integrated at an interface between the diffused metals, so that the two silicon wafers were bonded together to obtain a bonding structure of Example 1. The bonding process was performed under an atmosphere of formic acid (gas). Through photographing a cross section of the bonding structure of Example 1 with an SEM, it was confirmed that occurrence of a bonding defect (for example, a void or a crack) was suppressed, achieving favorable bonding.

Example 2

Except for using, in place of coppers, silvers as metals contained in the metal film formed on the surface of the substrate and the surface of the semiconductor element, the almost same operation as that of Example 1 was performed to obtain a bonding structure of Example 2. Through photographing a cross section of the bonding structure of Example 2 with the SEM, it was confirmed that occurrence of a bonding defect was suppressed, achieving favorable bonding.

Example 3

Except for using, in place of a copper, a silver as the metal contained in the metal film formed on the surface of the semiconductor element, almost same operation as that of Example 1 was performed to obtain a bonding structure of Example 3. Through photographing a cross section of the bonding structure of Example 3, it was confirmed that occurrence of a bonding defect was suppressed, achieving favorable bonding.

Example 4

In the laminated body production process, except for a thermal stress absorber, whose entire surface was coated with a silver film, arranged between the metal film formed on the surface of the substrate and the metal film formed on the surface of the semiconductor element, the almost same operation as that of Example 2 was performed to obtain a bonding structure of Example 4. The thermal stress absorber was obtained by evaporating an entire surface of a molybdenum plate (of 50 μm in thickness) with a silver in a thickness of 1.0 μm. Through photographing a cross section of the bonding structure of Example 4 with the SEM, it was confirmed that occurrence of a bonding defect was suppressed, achieving favorable bonding.

Comparative Example

Except for copper plates (sized 6 mm×6 mm×0.5 mm and 3 mm×3 mm×0.5 mm), in place of the silicon wafers, used as the substrate and the semiconductor element, the almost same technique as that of Example 2 was used in attempt to obtain a bonding structure. However, the copper has the same level of a thermal expansion coefficient as the silver (the silver has a thermal expansion coefficient of $18.9 \times 10^{-6}$ and the copper has a thermal expansion coefficient of $16.8 \times 10^{-6}$), which therefore caused no stress migration. Thus, the substrate and the semiconductor element could not favorably be bonded together, resulting in failure to obtain a bonding structure.

Figure 10:
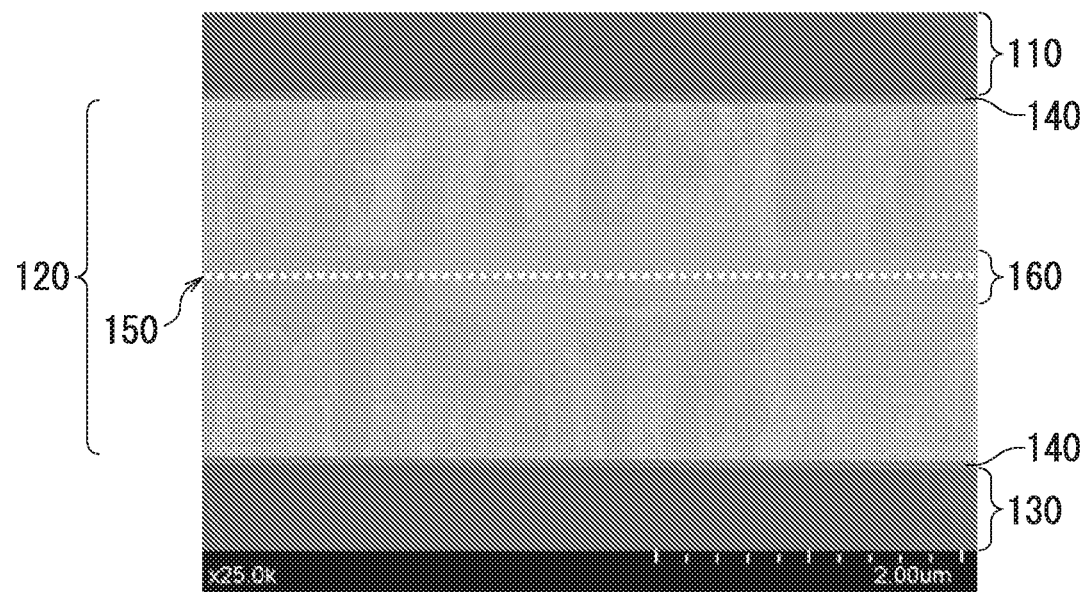
FIG. 10 is an SEM photograph of a cross section of a bonding structure of Example 2.

FIG. 10 is a photograph of a cross section of the bonding structure of Example 2 taken with the SEM. As is clear from FIG. 10, in the bonding structure of Example 1, the silver contained in the metal film formed on the surface of the substrate and the silver contained in the metal film formed on the surface of the semiconductor element were diffused through stress migration, thus forming, on a bonding interface 150, a portion 160 where the aforementioned metal films are integrated. Then it was confirmed that the substrate 110 and the semiconductor element 130 were favorably bonded together with the metal film 120, which was obtained by integrating the aforementioned metal films, therebetween.

INDUSTRIAL APPLICABILITY

A bonding structure according to the present invention is suitably used in semiconductor mounting.

REFERENCE SIGNS LIST

100 First Bonding Structure
110 Substrate
120 Metal film
130 Semiconductor element
200 Second Bonding Structure
210 Substrate
220 Metal film formed on the surface of the substrate
230 Thermal stress absorber
240 Metal film formed on the surface of the semiconductor element
250 Semiconductor element
260 Through hole
270 Groove
280 Annular member
140 Adhesive layer
150 Bonding interface
160 Portion where the metal films are integrated

The invention claimed is:

1. A bonding structure comprising:
a substrate;
a metal film;
a semiconductor element; and
an adhesive layer located at a position, the position being at least one position of a position between the substrate and the metal film and a position between the metal film and the semiconductor element, wherein
the metal film contains a metal diffused through stress migration,
the substrate and the semiconductor element are bonded together with the metal film therebetween,
the metal film contains at least one selected from the group consisting of silver and copper,
the adhesive layer contains at least one selected from the group consisting of titanium, tungsten, chromium, hafnium, and a nitride, and
the at least one position of the adhesive layer is the position between the metal film and the semiconductor element.

2. The bonding structure according to claim 1, wherein either or both of a material contained in the substrate and a material contained in the semiconductor element have a lower thermal expansion coefficient than the metal contained in the metal film.

3. The bonding structure according to claim 1, wherein the bonding with the metal film proceeds through a redox reaction occurring on a surface before the bonding.

4. The bonding structure according to claim 1, wherein the metal contained in the metal film has a crystal in a fine state or a columnar state.

5. The bonding structure according to claim 1, wherein the adhesive layer has a thickness of at least 0.01 μm and no greater than 0.05 μm.

6. The bonding structure according to claim 1, wherein the adhesive layer is located at each of the position between the substrate and the metal film and the position between the metal film and the semiconductor element.

7. A bonding structure comprising; in order mentioned below:
a substrate;
a first metal film;
a thermal stress absorber;
a second metal film; and
a semiconductor element, wherein
at least one of a metal contained in the first metal film and a metal contained in the second metal film is diffused through stress migration,
the substrate and the thermal stress absorber are bonded together with the first metal film therebetween, and
the semiconductor element and the thermal stress absorber are bonded together with the second metal film therebetween.

8. The bonding structure according to claim 7, wherein a material contained in the substrate has a lower thermal expansion coefficient than the metal contained in the first metal film, and a material contained in the semiconductor element has a lower thermal expansion coefficient than the metal contained in the second metal film.

9. The bonding structure according to claim 7, wherein a material contained in the thermal stress absorber has a lower thermal expansion coefficient than the metal contained in the first metal film and the metal contained in the second metal film.

10. The bonding structure according to claim 7, wherein either or both of the metal contained in the first metal film and the metal contained in the second metal film has a crystal in a fine state or a columnar state.

11. The bonding structure according to claim 7, wherein the material contained in the thermal stress absorber is silicon, molybdenum, or tungsten.

12. The bonding structure according to claim 7, wherein the thermal stress absorber has a through hole or a recess.

13. The bonding structure according to claim 7, wherein the bonding with at least one of the first metal film and the second metal film proceeds through a redox reaction occurring on a surface before the bonding.

14. A method for producing a bonding structure, comprising:
providing a substrate and a semiconductor element;
forming an adhesive layer on at least one of a surface of the substrate and a surface of the semiconductor element;
forming a metal film on the adhesive layer;
producing a laminated body by superposing the substrate and the semiconductor element oppositely to each other in a manner such that the metal film located on the surface of the substrate with the adhesive layer therebetween and the metal film located on the surface of the semiconductor element with the adhesive layer therebetween make contact with each other or in a manner such that the metal film located on the surface of the substrate with the adhesive layer therebetween or the metal film located on the surface of the semiconductor element with the adhesive layer therebetween is arranged between the substrate and the semiconductor element; and
bonding the substrate and the semiconductor element together by heating the laminated body and diffusing either or both of a metal contained in the metal film located on the surface of the substrate with the adhesive layer therebetween and a metal contained in the metal film located on the surface of the semiconductor element with the adhesive layer therebetween through stress migration, wherein in the forming an adhesive layer, the adhesive layer contains at least one selected from the group consisting of titanium, tungsten, chromium, hafnium, and a nitride, in the forming a metal film, the metal film contains at least one selected from the group consisting of silver and copper, and in the forming an adhesive layer, the adhesive layer is formed on the surface of the semiconductor element.

15. The method for producing a bonding structure according to claim 14, wherein the bonding is performed at a temperature of at least 100° C. and no greater than 400° C.

16. The method for producing a bonding structure according to claim 14, wherein the adhesive layer has a thickness of at least 0.01 μm and no greater than 0.05 μm.

17. The method for producing a bonding structure according to claim 14, wherein in the forming an adhesive layer, the adhesive layer is formed on each of the surface of the substrate and the surface of the semiconductor element.

18. A method for producing a bonding structure, comprising:

forming a metal film on at least one of a surface of a substrate and a surface of a semiconductor element;

producing a laminated body by superposing the substrate and the semiconductor element oppositely to each other in a manner such that the metal film formed on the surface of the substrate and the metal film formed on the surface of the semiconductor element make contact with each other or in a manner such that the metal film formed on the surface of the substrate or the metal film formed on the surface of the semiconductor element is arranged between the substrate and the semiconductor element; and bonding the substrate and the semiconductor element together by heating the laminated body and diffusing either or both of the metal contained in the metal film formed on the surface of the substrate and a metal contained in the metal film formed on the surface of the semiconductor element through stress migration, in the forming a metal film, the metal film is formed on the surface of the substrate and the surface of the semiconductor element, and in the producing a laminated body, a thermal stress absorber is laminated between the metal film formed on the surface of the substrate and the metal film formed on the surface of the semiconductor element.

* * * * *